US012185456B2

(12) United States Patent
Lee et al.

(10) Patent No.: US 12,185,456 B2
(45) Date of Patent: Dec. 31, 2024

(54) CIRCUIT BOARD WITH RIGID PORTION AND FLEXIBLE PORTION HAVING CONNECTING END AND ELECTRONIC PACKAGE USING THE SAME

(71) Applicants:First Hi-tec Enterprise Co., Ltd., Taoyuan (TW); NEXCOM International Co., Ltd., New Taipei (TW); Industrial Technology Research Institute, Hsinchu (TW)

(72) Inventors: Min-Lin Lee, Hsinchu (TW); Sheng-Che Hung, Hsinchu County (TW); Ching-Shan Chang, New Taipei (TW); Ying-Tsuen Liou, New Taipei (TW)

(73) Assignees: First Hi-tec Enterprise Co., Ltd., Taoyuan (TW); NEXCOM International Co., Ltd., New Taipei (TW); Industrial Technology Research Institute, Hsinchu (TW)

( * ) Notice: Subject to any disclaimer, the term of this patent is extended or adjusted under 35 U.S.C. 154(b) by 458 days.

(21) Appl. No.: 17/564,225

(22) Filed: Dec. 29, 2021

(65) Prior Publication Data
US 2023/0189435 A1 Jun. 15, 2023

(30) Foreign Application Priority Data
Dec. 9, 2021 (TW) .................. 110146168

(51) Int. Cl.
*H05K 1/02* (2006.01)
*H01R 12/73* (2011.01)
(Continued)

(52) U.S. Cl.
CPC ........... *H05K 1/0278* (2013.01); *H01R 12/73* (2013.01); *H01R 13/6461* (2013.01);
(Continued)

(58) Field of Classification Search
CPC .. H05K 1/0278; H05K 1/0219; H05K 1/0221; H05K 1/0222; H05K 1/028;
(Continued)

(56) References Cited

U.S. PATENT DOCUMENTS 5,144,742 A 9/1992 Lucas et al.
6,717,071 B2 4/2004 Chang et al.
(Continued)

FOREIGN PATENT DOCUMENTS

CN 102665371 9/2012
CN 102256438 5/2013
(Continued)

OTHER PUBLICATIONS

"Office Action of Taiwan Counterpart Application", issued on Mar. 7, 2023, pp. 1-12.

*Primary Examiner* — Justin M Kratt
(74) *Attorney, Agent, or Firm* — JCIPRNET

(57) ABSTRACT

A circuit board and an electronic package using the same are provided. The circuit board includes a rigid board body, at least one bendable extension portion, connecting members, and shielding members. The rigid board body includes conductive layers and dielectric layers therebetween. The extension portion is connected to a side of the rigid board body and formed by layers of the conductive layers and at least one layer of the dielectric layers extending outside the rigid board body. The connecting members are arranged on a connecting end of the extension portion and electrically connected to a signal layer of the conductive layers. The shielding members are arranged around the corresponding connecting members and electrically connected to a ground layer of the conductive layers. The connecting members and
(Continued)

the shielding members protrude from the connecting end. A height of the shielding members is lower than a height of the connecting members.

18 Claims, 13 Drawing Sheets

(51) Int. Cl.
| | | |
|---|---|---|
| *H01R 13/6461* | (2011.01) | |
| *H05K 3/42* | (2006.01) | |
| *H01R 12/77* | (2011.01) | |
| *H01R 12/78* | (2011.01) | |
| *H01R 12/81* | (2011.01) | |
| *H01R 13/26* | (2006.01) | |
| *H01R 13/6471* | (2011.01) | |
| *H01R 13/648* | (2006.01) | |
| *H01R 13/658* | (2011.01) | |
| *H01R 13/6581* | (2011.01) | |
| *H01R 13/6585* | (2011.01) | |
| *H05K 3/46* | (2006.01) | |

(52) U.S. Cl.
CPC ......... *H05K 1/0219* (2013.01); *H05K 1/0221* (2013.01); *H05K 1/0222* (2013.01); *H05K 1/028* (2013.01); *H05K 3/429* (2013.01); *H01R 12/77* (2013.01); *H01R 12/771* (2013.01); *H01R 12/774* (2013.01); *H01R 12/775* (2013.01); *H01R 12/777* (2013.01); *H01R 12/778* (2013.01); *H01R 12/78* (2013.01); *H01R 12/81* (2013.01); *H01R 13/26* (2013.01); *H01R 13/6471* (2013.01); *H01R 13/648* (2013.01); *H01R 13/658* (2013.01); *H01R 13/6581* (2013.01); *H01R 13/6585* (2013.01); *H05K 1/0216* (2013.01); *H05K 1/0218* (2013.01); *H05K 1/0277* (2013.01); *H05K 1/0283* (2013.01); *H05K 3/42* (2013.01); *H05K 3/4691* (2013.01); *H05K 2201/0723* (2013.01); *H05K 2201/09554* (2013.01); *H05K 2201/09618* (2013.01); *H05K 2201/09809* (2013.01)

(58) Field of Classification Search
CPC .... H05K 3/429; H05K 1/0216; H05K 1/0218; H05K 1/0277; H05K 1/0283; H05K 3/42; H05K 3/4691; H05K 2201/0723; H05K 2201/09554; H05K 2201/09618; H05K 2201/09809; H01R 12/73; H01R 13/6461; H01R 12/77; H01R 12/771; H01R 12/774; H01R 12/775; H01R 12/777; H01R 12/778; H01R 12/78; H01R 12/81; H01R 13/26; H01R 13/6471; H01R 13/648; H01R 13/658; H01R 13/6581; H01R 13/6585
See application file for complete search history.

(56) References Cited

U.S. PATENT DOCUMENTS

| | | | |
|---|---|---|---|
| 8,609,991 | B2 | 12/2013 | Takahashi |
| 9,113,551 | B2 | 8/2015 | McClatchie et al. |
| 9,253,898 | B2 | 2/2016 | Chen et al. |
| 9,536,815 | B2 | 1/2017 | Rathburn |
| 9,717,151 | B2 | 7/2017 | Taniguchi et al. |
| 9,900,997 | B2 | 2/2018 | Chen et al. |
| 11,019,736 | B2 | 5/2021 | Woo et al. |
| 11,894,629 | B2 * | 2/2024 | Consoli ................ H05K 1/095 |
| 2006/0103004 | A1 | 5/2006 | Sakai et al. |
| 2011/0199739 | A1 * | 8/2011 | Naganuma ........... H05K 3/4691 29/829 |
| 2013/0084718 | A1 | 4/2013 | Kobayashi et al. |
| 2014/0216792 | A1 | 8/2014 | Sebanz et al. |
| 2015/0101847 | A1 | 4/2015 | Tsai |
| 2018/0108968 | A1 * | 4/2018 | Purden ............. H01L 23/49827 |

FOREIGN PATENT DOCUMENTS

| | | |
|---|---|---|
| CN | 110784995 | 2/2020 |
| CN | 111463600 | 7/2020 |
| CN | 113423172 | 9/2021 |
| TW | 201526392 | 7/2015 |
| TW | I601348 | 10/2017 |

* cited by examiner

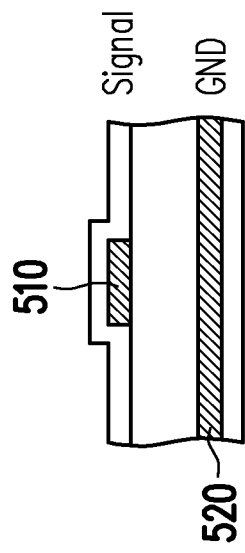
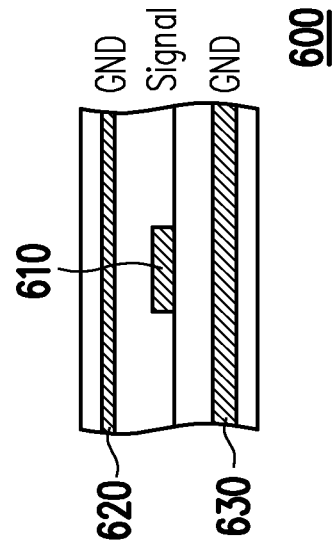
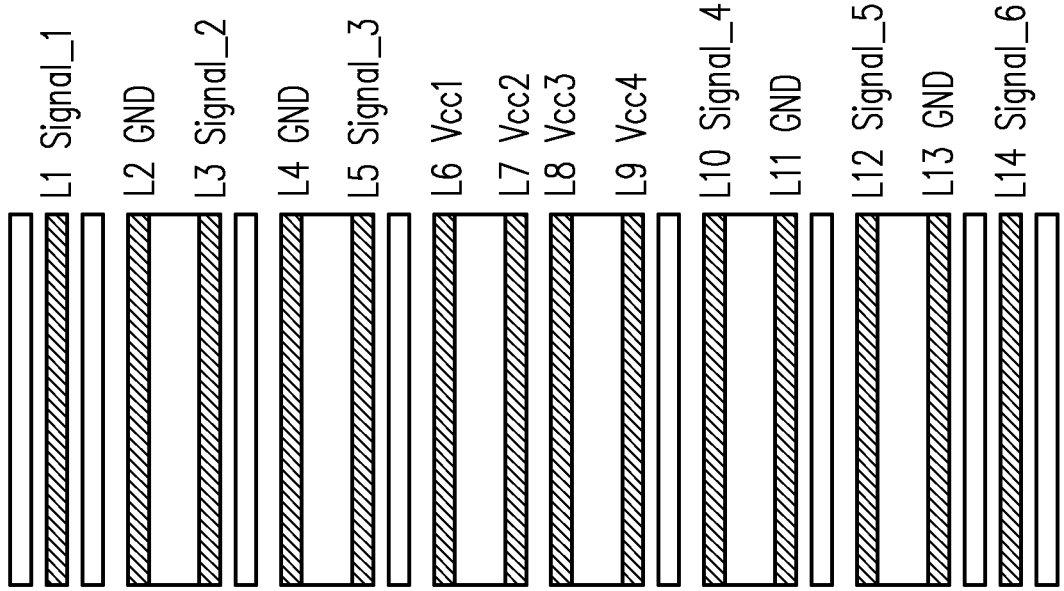
FIG. 5
FIG. 6
FIG. 4

CIRCUIT BOARD WITH RIGID PORTION AND FLEXIBLE PORTION HAVING CONNECTING END AND ELECTRONIC PACKAGE USING THE SAME

CROSS-REFERENCE TO RELATED APPLICATION

This application claims the priority benefit of Taiwan application serial no. 110146168, filed on Dec. 9, 2021. The entirety of the above-mentioned patent application is hereby incorporated by reference herein and made a part of this specification.

BACKGROUND

Technical Field

The disclosure relates to an electronic package component.

Description of Related Art

In recent years, high-speed signal transmission technology has been developing rapidly. Wired high-speed transmission input/output (I/O) interfaces, such as SD8.0 for data and audiovisual storage, Ethernet CAT8 for network communication, USB4 and Thunderbolt4 compatible with charging/data/audiovisual transmission, and HDMI 2.0 and Displayport 2.1 for audiovisual transmission, all use higher-speed rise time or lower voltage level technology to implement high-speed transmission. However, limited by the existing specifications and characteristics of electronic package components, such as main control chips, connectors, cables, and circuit boards, the transmission speed and performance of the transmission interfaces are limited.

In particular, when the computing speed of the main control chip continues to increase, components, such as connectors and cables, are limited by the original structural defects, and there are issues, such as high reflection loss and characteristic impedance mismatch between components, with the usage requirements of conventional products, such that the overall electronic package must be used in a downgraded manner, which is difficult to achieve the true high-speed specifications. Therefore, in order to achieve the target of high-speed transmission, optimization processing, such as material and structural improvement, and characteristic impedance matching, needs to be performed on the electronic package components used in the signal transmission path.

SUMMARY

A circuit board of the disclosure includes a rigid board body, at least one bendable extension portion, multiple connecting members, and multiple shielding members. The rigid board body includes multiple conductive layers and multiple dielectric layers located between the conductive layers. The extension portion is connected to a side of the rigid board body and is formed by multiple layers of the conductive layers and at least one layer of the dielectric layers extending outside the rigid board body, and an end of the extension portion is a connecting end. The connecting members are arranged on a surface of the connecting end and are electrically connected to a signal layer of the conductive layers. The shielding members are arranged on the surface of the connecting end and are electrically connected to a ground layer of the conductive layers. The shielding member is arranged around the corresponding connecting member, the connecting members and the shielding members protrude from the surface of the connecting end, and a height of the shielding members is lower than a height of the connecting members.

The disclosure further provides an electronic package applied with the circuit board. The rigid board body of the circuit board is, for example, a motherboard, and the electronic package further includes a first electronic element joined to the rigid board body and a second electronic element joined to the connecting end and electrically connected to the connecting members.

The disclosure further provides another electronic package applied with the circuit board. The rigid board body of the circuit board is, for example, a bus board, and the electronic package further includes a motherboard carrying the rigid board body, a first electronic element electrically connected to the motherboard, and a second electronic element electrically connected to the connecting members at the connecting end.

The disclosure further provides a circuit board, which includes a rigid board body, at least one bendable extension portion, and multiple connecting members. The rigid board body includes multiple conductive layers and multiple dielectric layers located between the conductive layers. The extension portion is connected to a side of the rigid board body and is formed by multiple layers of the conductive layers and at least one layer of the dielectric layers extending outside the rigid board body, and an end of the extension portion is a connecting end. The connecting members are arranged on a surface of the connecting end and are electrically connected to a signal layer of the conductive layers.

BRIEF DESCRIPTION OF THE DRAWINGS

FIG. 4 shows a possible circuit configuration of a rigid board body according to an embodiment of the disclosure.

FIG. 5 and FIG. 6 respectively show possible circuit configurations of connecting ends according to the circuit configuration of the rigid board body of FIG. 4.

DETAILED DESCRIPTION OF DISCLOSED EMBODIMENTS

In the following, multiple embodiments are used to describe the technical solution of the disclosure, wherein the same or similar parts in the embodiments will not be repeated. Persons skilled in the art should cross-reference to the descriptions of the embodiments to understand the spirit of the disclosure and implement the same accordingly.

Figure 1:
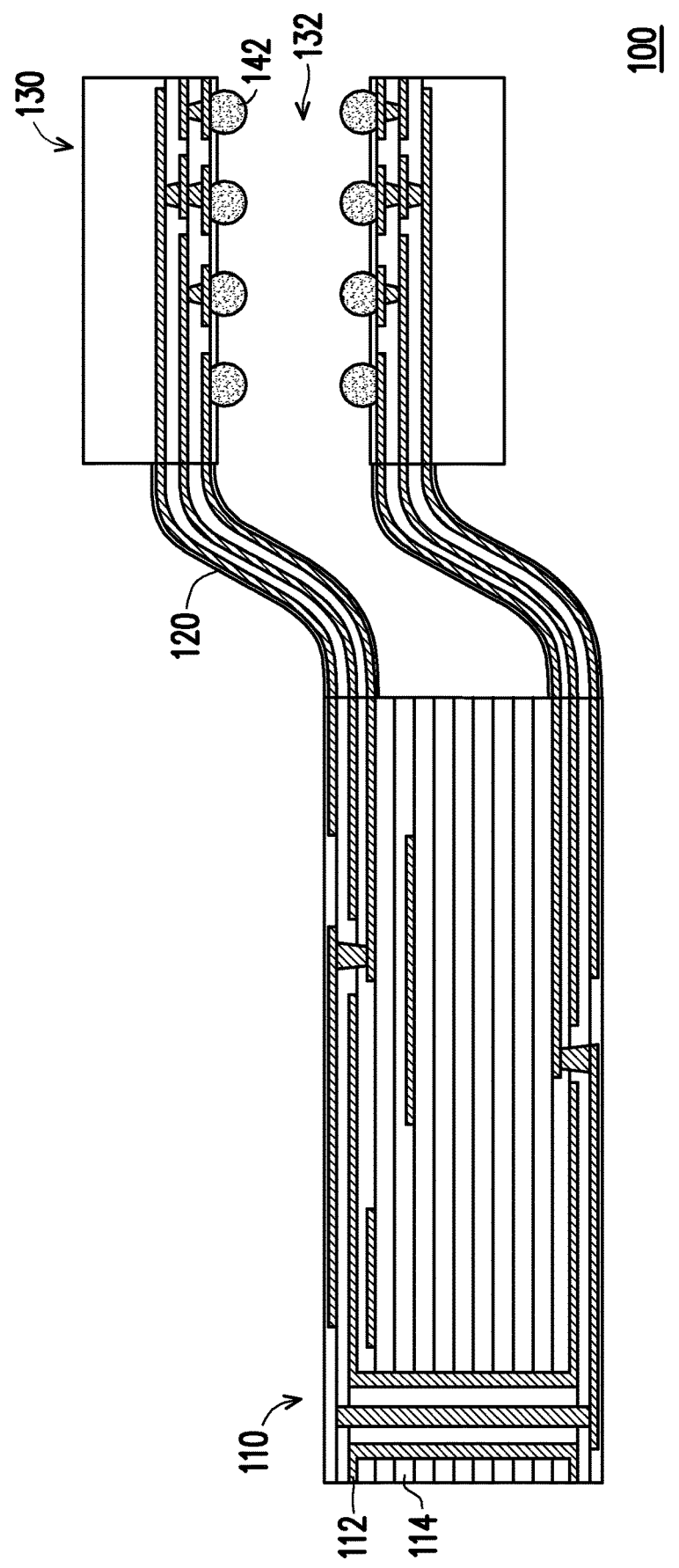
FIG. 1 shows a circuit board according to an embodiment of the disclosure.

FIG. 1 shows a circuit board 100 according to an embodiment of the disclosure. The circuit board 100 includes a rigid board body 110, which is, for example, a multilayer circuit board formed by overlapping multiple conductive layers 112 and multiple dielectric layers 114, wherein a part of the conductive layers 112 and a part of the dielectric layers 114 extend outside the rigid board body 110 and form an extension portion 120 on a side of the rigid board body 110. An end of the extension portion 120 forms a connecting end 130, and multiple connecting members 142, such as multiple solder balls, are disposed on a surface of the connecting end 130 to externally connect to other electronic elements. Specifically, the embodiment shows that one or more extension portions 120 (shown as two in the drawing) are formed on the same side of the rigid board body 110, and the surfaces of the connecting ends 130 of the two extension portions 120 are arranged opposite to each other, and a possible housing (not shown in the drawing) is, for example, covered on the outside to form a connector for an external electronic element to be plugged in. A space between the two connecting ends 130 forms a jack 132, so that when the external electronic element is inserted, the external electronic element forms an electrical path with the connecting member 142 in the jack 132.

In the embodiment, the extension portion 120 may be located at any suitable position on the side of the rigid board body 110, and the quantity is not limited. For example, the two extension portions 120 shown in FIG. 1 are located on the same plane position on the side of the rigid board body 110. The plane position here refers to a position in a plane direction parallel to a surface of the rigid board body 110. In other words, the two extension portions 120 extend outward from the same position on the side of the rigid board body 110 and are respectively formed by different layers of the conductive layers 112 and the dielectric layers 114. Since the extension portion 120 is only composed of a part of the conductive layers 112 and the dielectric layers 114, the thickness is relatively thin, and a suitable material may be selected to manufacture the dielectric layer 114, so that the overall extension portion 120 has a bendable characteristic to provide a function similar to the bridging function of cables in a conventional electronic package.

In addition, as the number of circuit layers of the rigid board body 110 is different, the composition of the extension portion 120 and the connecting end 130 may have various changes. For example, if the rigid board body 110 is an 8-layer board, the extension portion 120 and the connecting end 130 thereof shown in FIG. 1 include at most 4 conductive layers; and if the rigid board body 110 is a 16-layer board, the extension portion 120 and the connecting end 130 thereof shown in FIG. 1 include at most 8 conductive layers. The number of conductive layers of the extension portion 120 and the connecting end 130 thereof may be the same or different and may be analogized and determined depending on requirements.

Figure 2:
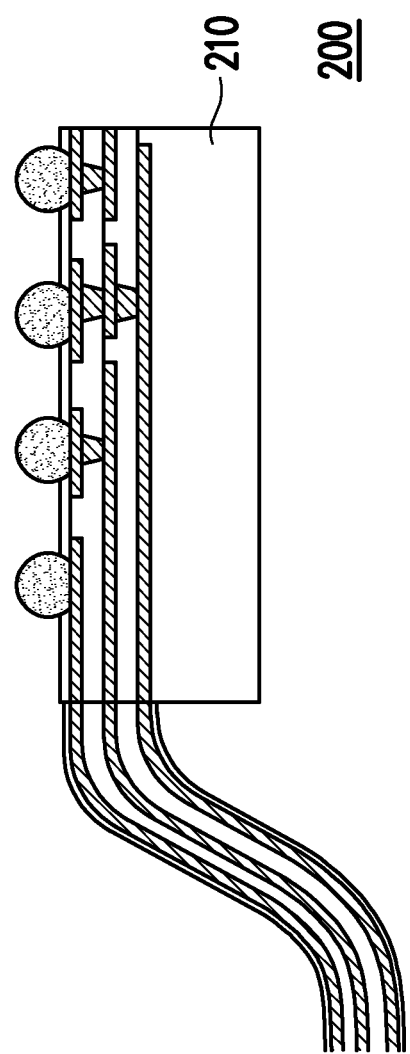
FIG. 2 shows a connecting end of a circuit board according to an embodiment of the disclosure.
Figure 3:
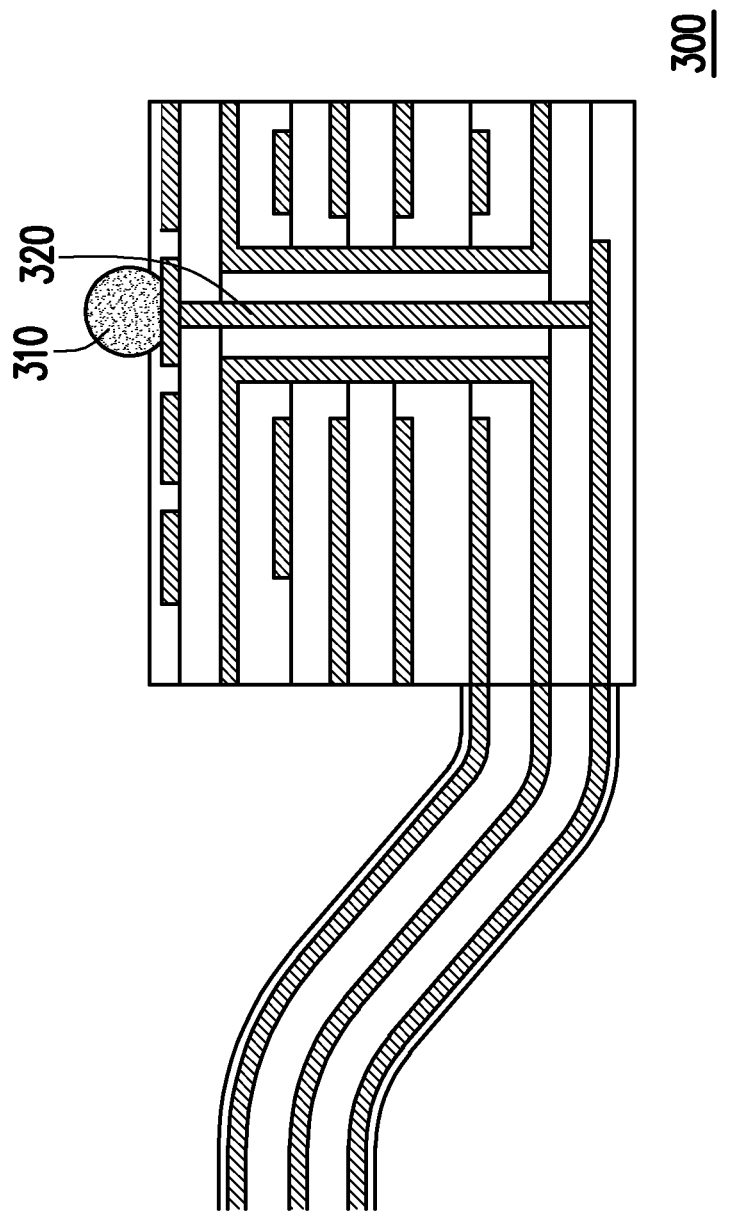
FIG. 3 shows a connecting end of a circuit board according to another embodiment of the disclosure.

FIG. 2 and FIG. 3 are respectively schematic diagrams of connecting ends according to different embodiments of the disclosure. A connecting end 200 shown in FIG. 2 has, for example, 4 or less layers of the conductive layers (shown as 3 layers in the drawing). At this time, considering that the thickness is relatively thin, a supporting substrate 210 (such as a two-layer board) may be added to a back side of the connecting end 200 to increase the rigidity of the connecting end 200. In addition, a connecting end 300 shown in FIG. 3 has, for example, more than 4 layers of the conductive layers (shown as 8 layers in the drawing), which may have a conductive hole 320 inside, such as a via, a plating through hole (PTH), or a coaxial via 320 as shown in the drawing, so that the connecting member 310 may be connected to a lower signal layer via the conductive hole 320. The specific circuit structure of the connecting end will be described in the following embodiments.

On the other hand, the actual circuit configuration of the connecting end of the circuit board of the disclosure is related to the circuit configuration of the rigid board body. FIG. 4 shows a possible circuit configuration of a rigid board body according to an embodiment of the disclosure. FIG. 5 and FIG. 6 respectively show possible circuit configurations of connecting ends according to the circuit configuration of the rigid board body of FIG. 4. As shown in FIG. 4, a rigid board body 400 is, for example, a 14-layer board, and the circuit configuration of each layer of L1 to L14 is as shown in the drawing, which includes 6 signal layers Signal_1 to Signal_6, 4 ground layers GND, and 4 power supply layers Vcc1 to Vcc4. Correspondingly, the connecting end may be a combination of the conductive layers.

For example, a connecting end 500 shown in FIG. 5 has a micro stripline structure, wherein a signal layer 510 is located on an upper layer and is electrically connected to one layer of the 6 signal layers Signal_1 to Signal_6 (such as the signal layer Signal_1 of L1), and a ground layer 520 is located on a lower layer and is electrically connected to one layer of the 4 ground layers GND (such as the ground layer GND of L2). In other words, the conductive layers of the connecting end 500 are Signal_1/GND of L1 and L2. Alternatively, in other unshown embodiments, for a 3-layer circuit structure, Signal_1/GND/Signal_2 of L1 to L3, Signal_2/GND/Signal_3 of L3 to L5, or other possible combinations may be selected as the conductive layers of the connecting end 500.

For another example, a connecting end 600 shown in FIG. 6 has a stripline structure, wherein a signal layer 610 is located between two ground layers 620 and 630, and is electrically connected to one layer of the 6 signal layers Signal_1 to Signal_6 (such as the signal layer Signal_2 of L3), and the ground layers 620 and 630 are respectively electrically connected to one layer of the 4 ground layers GND (such as the ground layer GND of L2 and the ground layer GND of L4). In other words, the conductive layers of the connecting end 600 are GND/Signal_2/GND of L2 to L4. Alternatively, in other unshown embodiments, GND/Signal_3/Vcc1 of L4 to L6 or other possible combinations may be selected as the conductive layers of the connecting end 600.

In addition, in order to reduce signal interference, the disclosure may also dispose a shielding member on the surface of the connecting end, so that the shielding member and the connecting member for signal transmission are jointly located in the formed jack of the connector, and the shielding member surrounds the connecting member to shield possible signal interference. The multiple embodiments below also take the rigid board body 400 of FIG. 4 as an example to describe possible circuit structures corresponding to the connecting end of the rigid board body 400.

Figure 7:
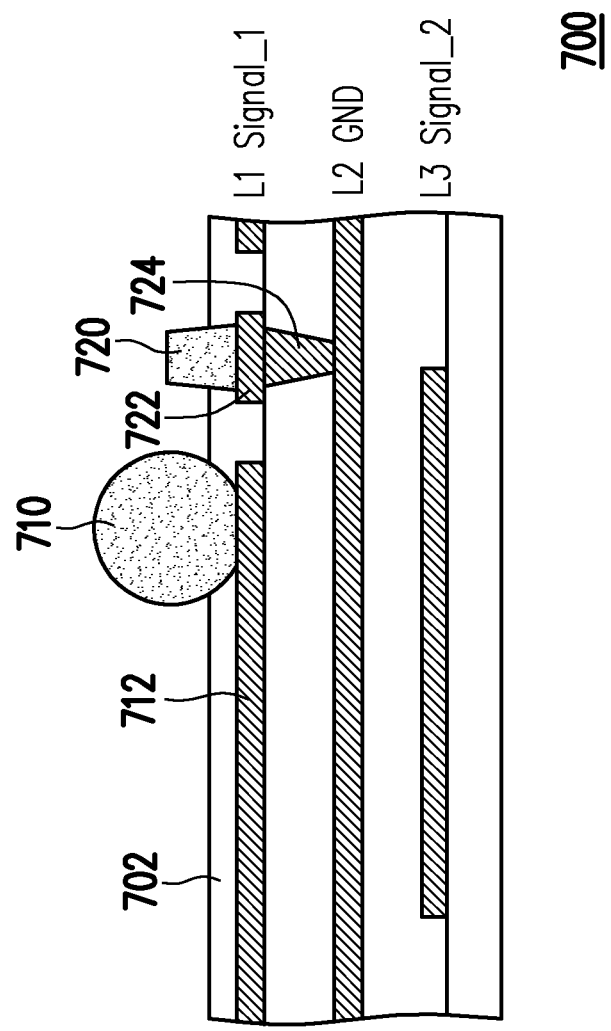
FIG. 7 and FIG. 8 respectively show partial cross-sectional views of connecting ends according to different embodiments of the disclosure.

FIG. 7 shows a partial cross-sectional view of a connecting end according to an embodiment of the disclosure, wherein a connecting end 700 has a 3-layer circuit structure, for example, corresponding to the conductive layers L1 to L3, that is, Signal_1/GND/Signal_2, of the rigid board body 400 of FIG. 4, and the connecting end 700 has a solder mask layer 702 covering a first pad 712 and a second pad 722 of the conductive layer L1. Connecting members 710 are, for example, multiple solder balls formed on the first pad 712, and shielding members 720 are, for example, multiple solder bumps formed on the second pad 722, wherein the connecting members 710 and the shielding members 720 all protrude from a surface of the solder mask layer 702, and a height of the shielding members 720 is lower than a height of the connecting members 710. Since the conductive layer L1 is used as the signal layer Signal_1, the connecting member 710 may be connected to a signal source via the first pad 712 for signal transmission. In addition, the second pad 722 is independent of the signal layer Signal_1, so that the shielding member 720 may be electrically connected to the ground layer of L2 below via the second pad 722 and a via 724.

Figure 8:
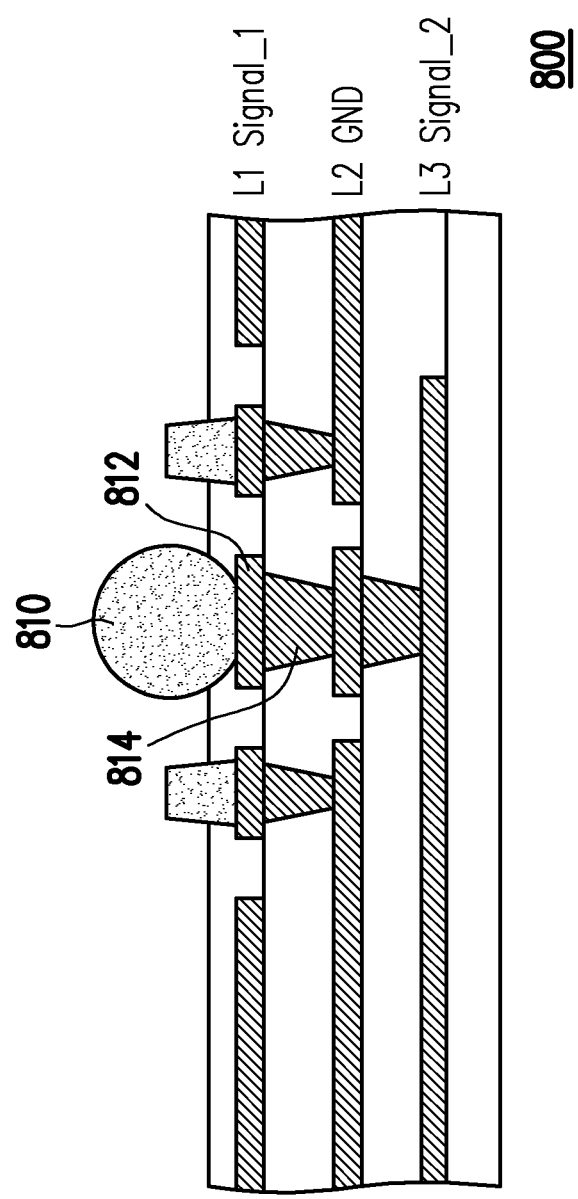

FIG. 8 shows a partial cross-sectional view of a connecting end according to another embodiment of the disclosure. A connecting end 800 of the embodiment is similar to the connecting end 700 shown in FIG. 7 and also has a 3-layer circuit structure, for example, corresponding to the conductive layers L1 to L3, that is, Signal_1/GND/Signal_2 of the rigid board body 400 of FIG. 4. The main difference between the two is that a connecting member 810 of the embodiment is connected to the conductive layer L3 below, that is, Signal_2, via a first pad 812 and a via 814 for signal transmission.

Figure 11:
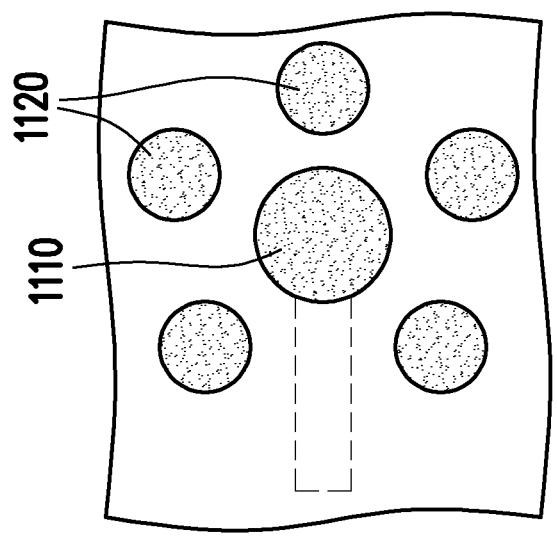
FIG. 9 to FIG. 11 respectively show planar configurations of connecting members and shielding members according to different embodiments of the disclosure.
Figure 10:
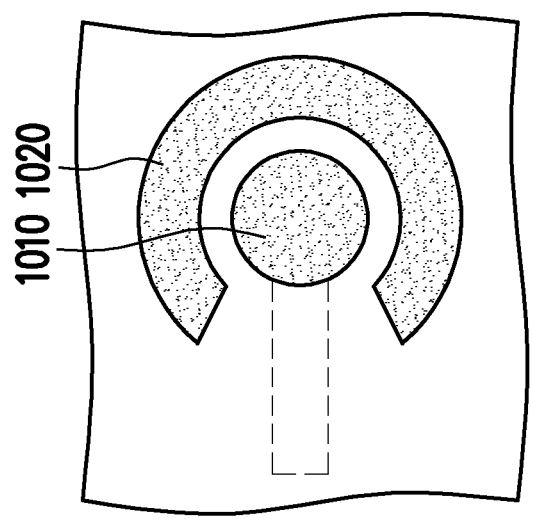
Figure 9:
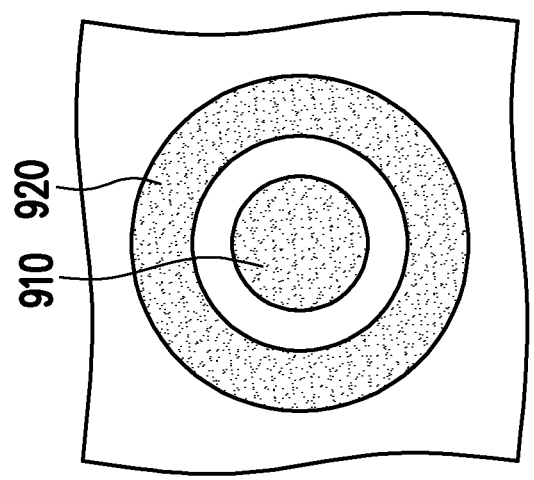

In the plane direction, the shielding member of the disclosure surrounds the connecting member to shield signal interference. Specifically, FIG. 9 to FIG. 11 respectively list several possible planar configurations of connecting members and shielding members, wherein a shielding member 920 shown in FIG. 9 is a closed annular wall surrounding a connecting member 910, a shielding member 1020 shown in FIG. 10 is an open arc wall surrounding a connecting member 1010, and shielding members 1120 shown in FIG. 11 are, for example, multiple columns arranged around a connecting member 1110.

Figure 12:
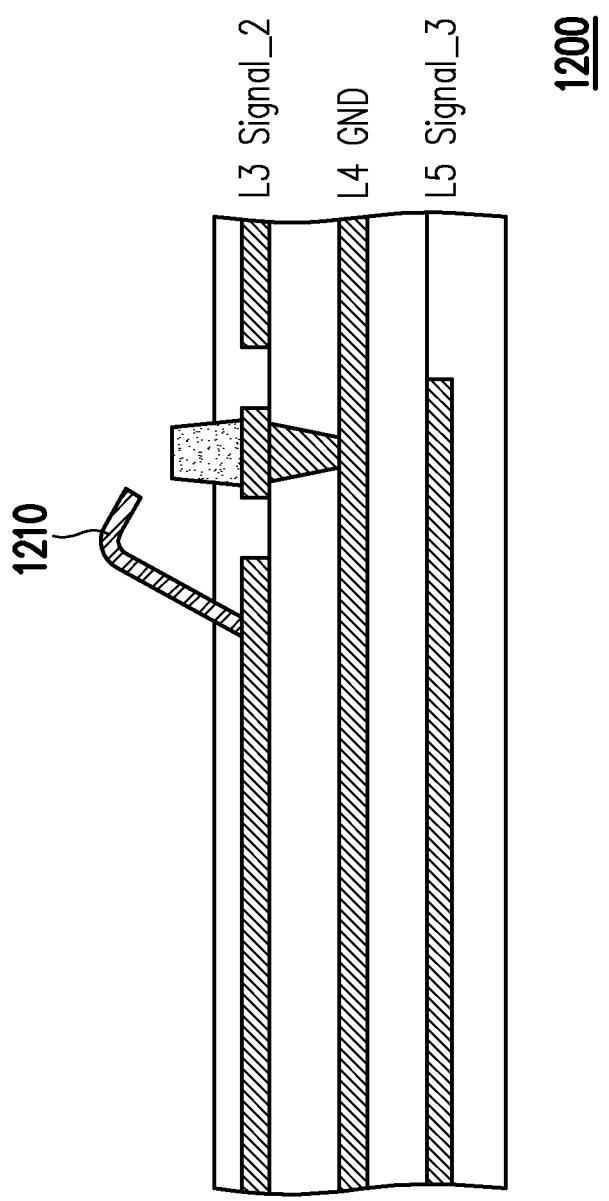
FIG. 12 and FIG. 13 respectively show partial cross-sectional views of connecting ends according to different embodiments of the disclosure.
Figure 13:
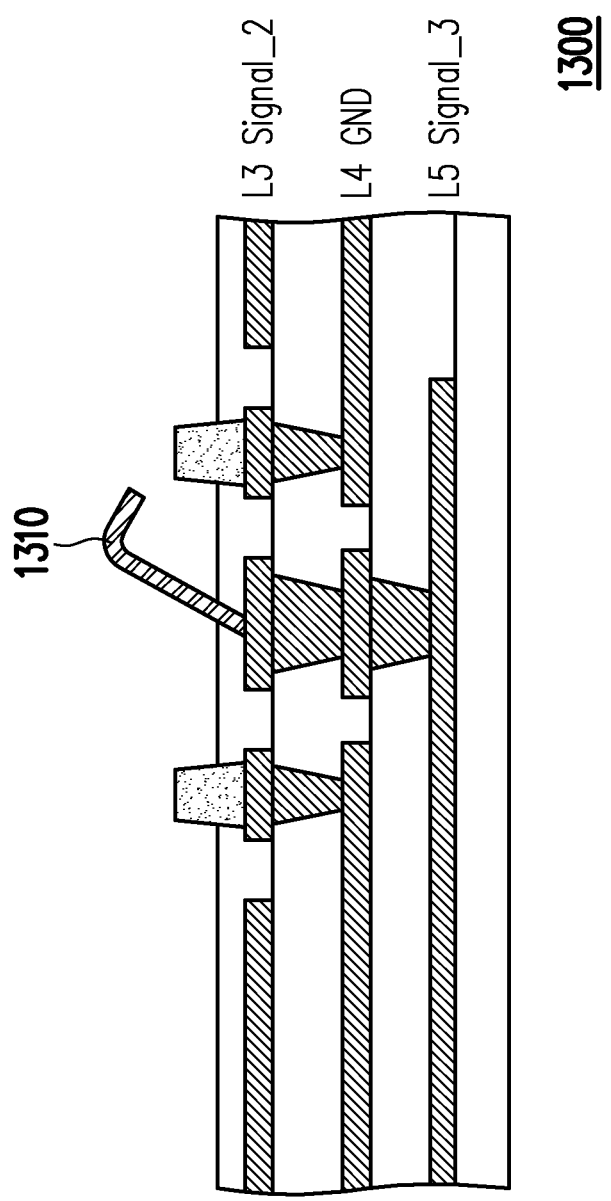

FIG. 12 and FIG. 13 respectively show partial cross-sectional views of connecting ends according to other embodiments of the disclosure. A connecting end 1200 of FIG. 12 and a connecting end 1300 of FIG. 13 respectively have similar circuit structures as the connecting end 700 of FIG. 7 and the connecting end 1100 of FIG. 11. The main difference is that the connecting end 1200 of FIG. 12 and the connecting end 1300 of FIG. 13 both adopt leaf springs as a connecting member 1210 and a connecting member 1310.

Figure 14:
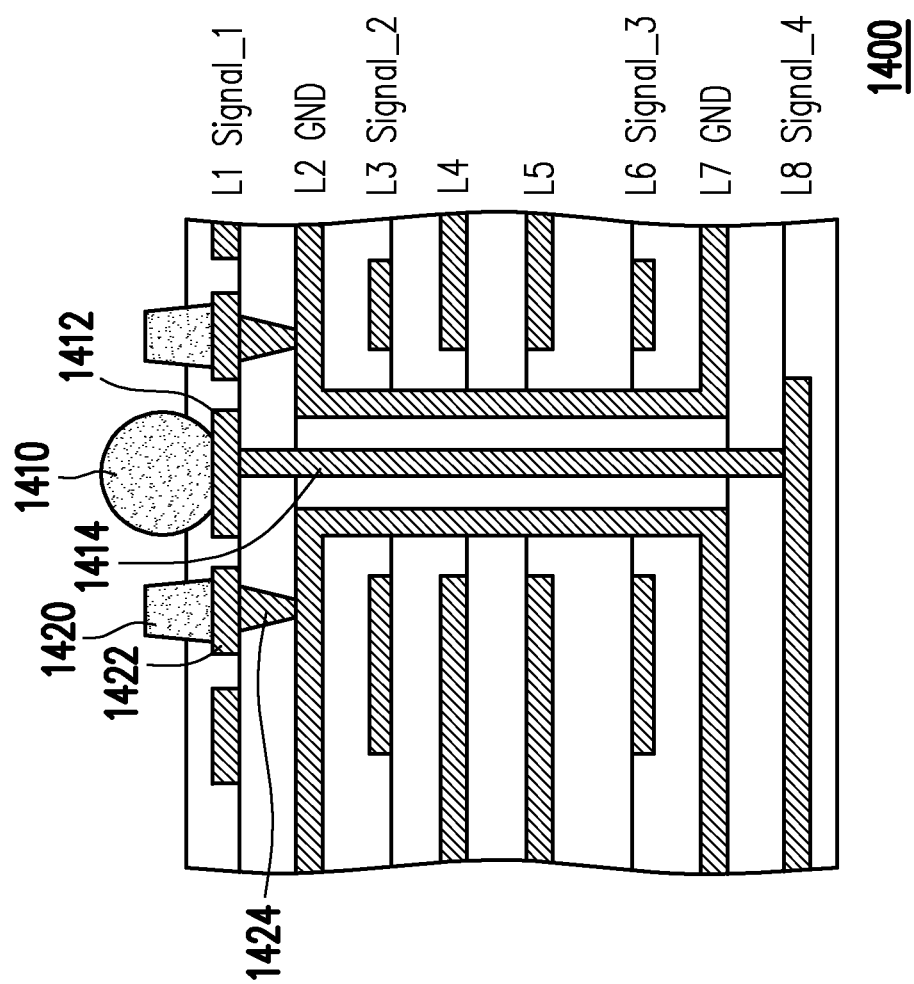
FIG. 14 and FIG. 15 respectively show partial cross-sectional views of connecting ends according to different embodiments of the disclosure.

FIG. 14 shows a partial cross-sectional view of a connecting end according to another embodiment of the disclosure. A connecting end 1400 has an 8-layer circuit structure including the conductive layers L1 to L8, which are respectively Signal_1/GND/Signal_2 . . . Signal_3/GND/Signal_4. A connecting member 1410 is located on a first pad 1412 and is connected to the lowermost conductive layer L8, that is, Signal_4, via a plating through hole (PTH) 1414 penetrating and independent of the conductive layers L2 to L7 for signal transmission. A shielding member 1420 located on a second pad 1422 is electrically connected to the ground layer of L2 below via a via 1424. In the embodiment, the PTH 1414 may also be a coaxial via or other possible forms of conductive holes to achieve anti-interference or other effects.

Figure 15:
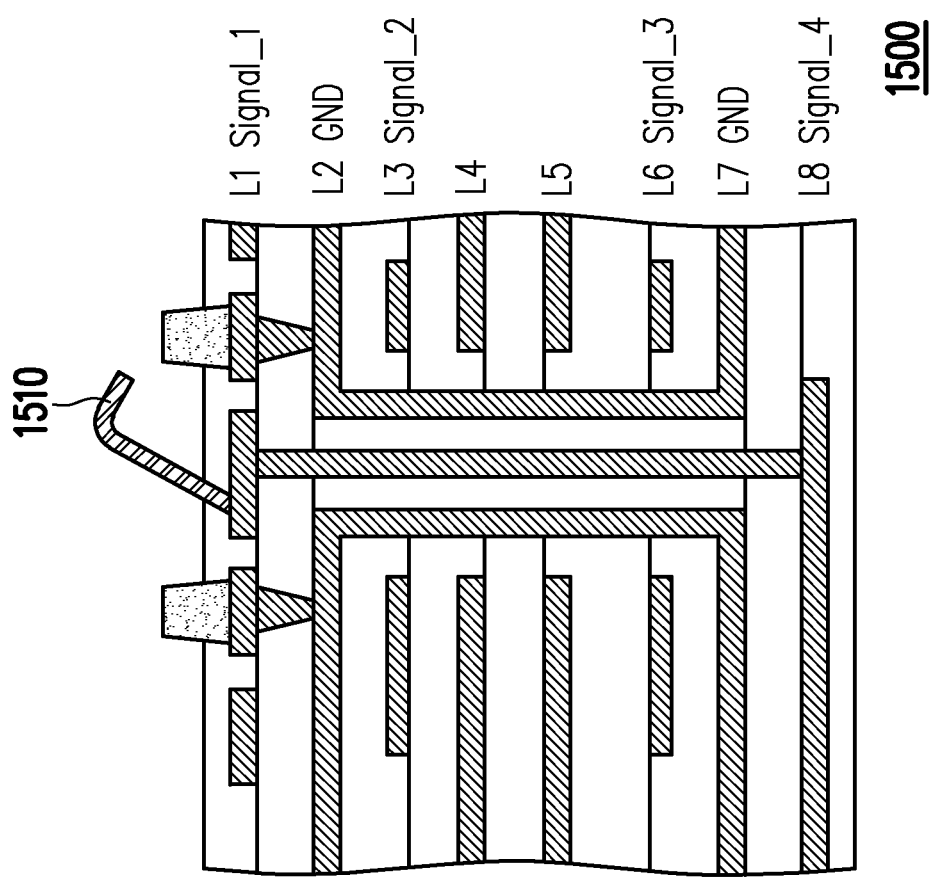

FIG. 15 is a partial cross-sectional view of a connecting end according to another embodiment of the disclosure. A connecting end 1500 of FIG. 15 and the connecting end 1400 of FIG. 14 have similar circuit structures. The main difference is that the connecting end 1500 of FIG. 15 adopts a leaf spring as a connecting member 1510.

Based on the multiple embodiments above, in the disclosure, the conductive layer and the dielectric layer in the rigid board body extend outward from the side to form the extension portion, which may replace the cables of the conventional electronic package, wherein the extension portion and the rigid board body have the same material characteristics to avoid the issue of characteristic impedance mismatch. In addition, the end of the extension portion is used as the connecting end of external connection, which may replace the connector of the conventional electronic package to avoid reflection loss caused by the connector. The connecting members, such as solder balls or leaf springs, that are equivalent to pins of the connector are disposed on the connecting end, and the shielding members are disposed on the periphery of the connecting members to reduce the interference of reflected signals.

Of course, the multiple embodiments above are only for illustration. Persons skilled in the art should understand that with the different circuit configurations of the rigid board body, actual wiring requirements, etc., there are various possible changes in the circuit structure of the extension portion and connecting end of the circuit board of the disclosure, and the changes may be implemented according to the technical level at the time of application.

Figure 16:
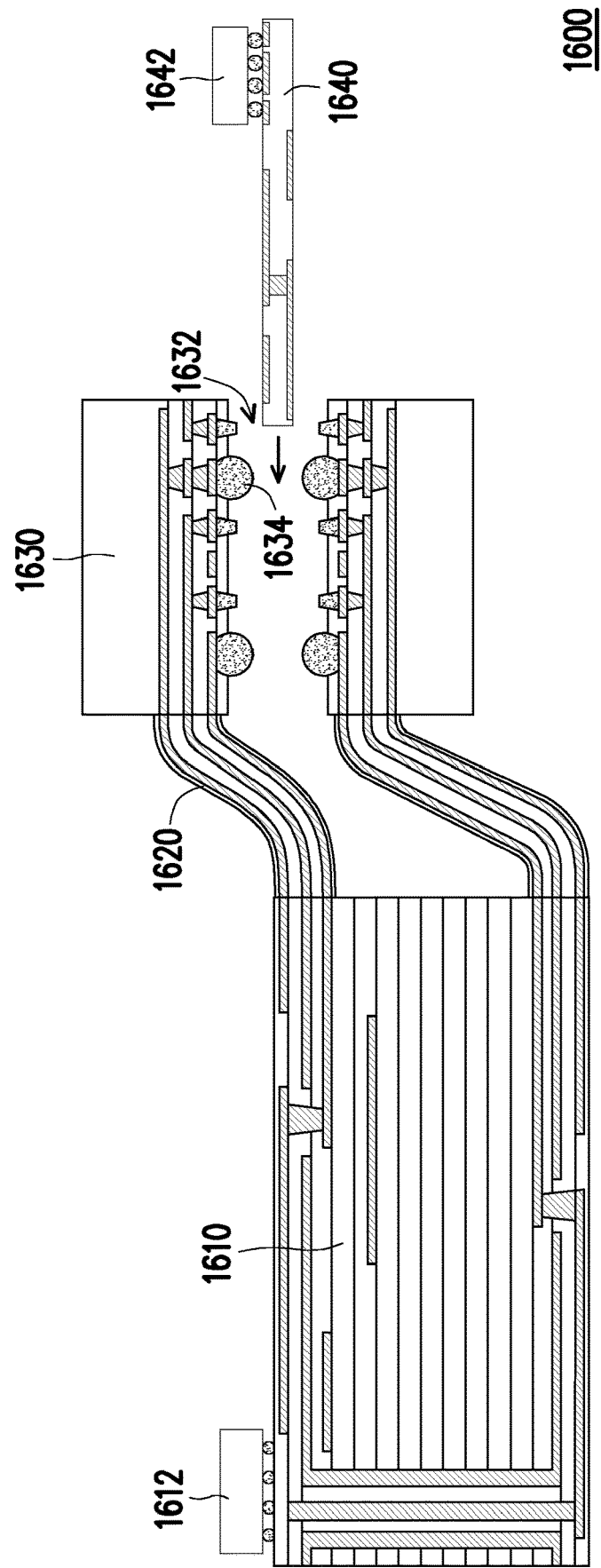
FIG. 16 shows an electronic package according to an embodiment of the disclosure.

FIG. 16 further shows an electronic package according to an embodiment of the disclosure, which may be applied with the circuit board of the disclosure to implement high-speed transmission with low reflection loss. As shown in FIG. 16, an electronic package 1600 of the embodiment is, for example, used in a high-speed network communication architecture, wherein a rigid board body 1610 of the circuit board is used as a motherboard to carry a first electronic element (such as a network signal transmitter or an integrated circuit (IC) chip) 1612, and a bendable extension portion 1620 extends outward from a side of the rigid board body 1610 and an end thereof forms a connecting end 1630 with a jack 1632. In addition, an external element 1640 with a second electronic element (such as a network signal receiver or an IC chip) 1642 may be inserted into the jack 1632 of the connecting end 1630 to be electrically connected to a connecting member 1634 in the jack 1632 and electrically connected to the rigid board body 1610 as the motherboard via the connecting end 1630 and the extension portion 1620 to implement high-speed transmission of network signals.

Figure 17:
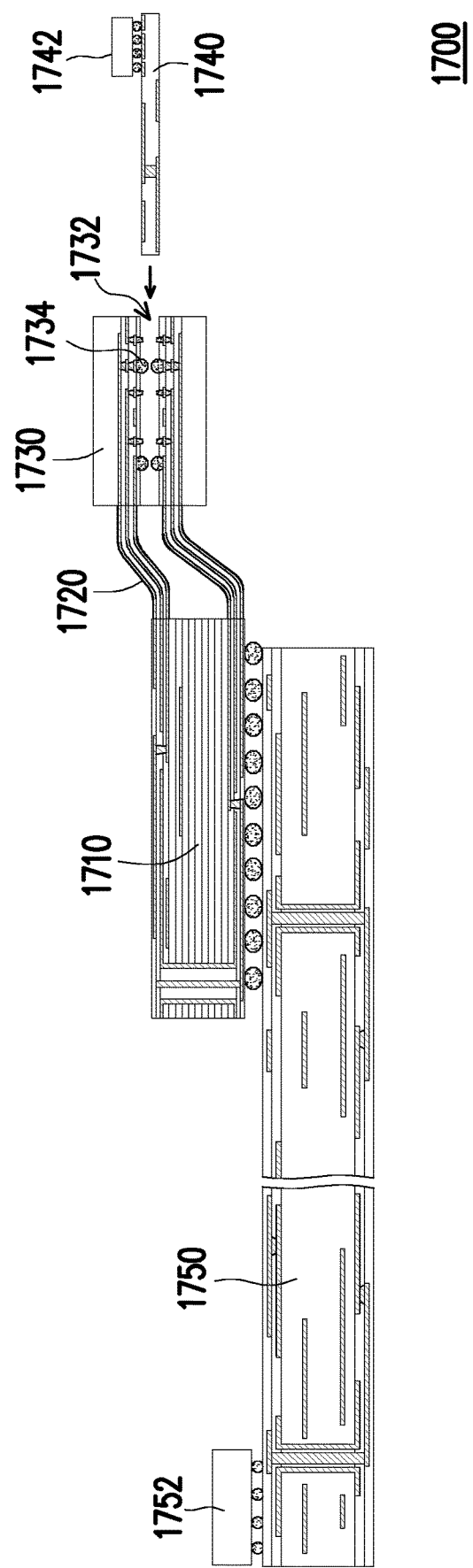
FIG. 17 shows an electronic package according to another embodiment of the disclosure.

FIG. 17 shows an electronic package according to another embodiment of the disclosure. An electronic package 1700 of the embodiment and the electronic package 1600 shown in FIG. 16 are both used in the high-speed network communication architecture. The difference is that a rigid board body 1710 of the circuit board of the embodiment is a bus board, which may be joined to an external motherboard 1750. There is a first electronic element (such as a network signal transmitter or an IC chip) 1752 on the motherboard 1750. A bendable extension portion 1720 extends outward from a side of the rigid board body 1710 and an end thereof is formed with a connecting end 1730 with a jack 1732. In addition, an external element 1740 with a second electronic element (such as a network signal receiver or an IC chip) 1742 may be inserted into the jack 1732 of the connecting end 1730 to be electrically connected to a connecting member 1734 in the jack 1732 and electrically connected to the motherboard 1750 via the connecting end 1730, the extension portion 1720, and the rigid board body 1710 to implement high-speed transmission of network signals. Compared with the embodiment shown in FIG. 16, the rigid board body 1710 of the embodiment is used as the bus board, and the formed extension portion 1720 and connecting end 1730 are not limited by the specifications of the motherboard 1750 to provide more flexible options for the elements and configurations of the electronic package 1700.

In summary, in the circuit board provided by the disclosure, the rigid board body may be used as the bus board or even directly used as the motherboard in the electronic package, and the extension portion may replace the cables of the conventional electronic package to provide good characteristic impedance matching. The connecting end at the end of the extension portion may replace the connector of the conventional electronic package to avoid reflection loss. In addition, in the disclosure, the shielding members are further disposed on the periphery of the connecting members to reduce signal interference. In this way, optimization processing, such as structural improvement and characteristic impedance matching, is performed on electronic package components for high-speed transmission to implement the target of high-speed transmission.

What is claimed is:

1. A circuit board, comprising:
   a rigid board body, comprising a plurality of conductive layers and a plurality of dielectric layers located between the conductive layers;
   at least one bendable extension portion, wherein each of the at least one extension portion is connected to a side of the rigid board body and is formed by a plurality of layers of the conductive layers and at least one layer of the dielectric layers extending outside the rigid board body, and an end of each of the at least one extension portion is a connecting end;
   a plurality of connecting members, arranged on a surface of the connecting end and electrically connected to a signal layer of the conductive layers; and
   a plurality of shielding members, arranged on the surface of the connecting end and electrically connected to a ground layer of the conductive layers, wherein each of the shielding members is arranged around the corresponding connecting member, the connecting members and the shielding members protrude from the surface of the connecting end, and a height of the shielding members is lower than a height of the connecting members,
   wherein the at least one extension portion comprises two extension portions on a same side of the rigid board body, surfaces of connecting ends of the two extension portions are arranged opposite to each other to form a jack of a connector, and the connecting members and the shielding members are located in the jack.

2. The circuit board according to claim 1, wherein the two extension portions are located on a same plane position on the side of the rigid board body and are respectively formed by different layers of the conductive layers and the dielectric layers.

3. The circuit board according to claim 2, wherein the two extension portions have a same number of conductive layers.

4. The circuit board according to claim 1, wherein the connecting end comprises a solder mask layer covering an outermost layer of the conductive layers and exposing a plurality of first pads and a plurality of second pads of the outermost layer of the conductive layers, the connecting members and the shielding members are respectively located on the first pads and the second pads, and protrude from a surface of the solder mask layer.

5. The circuit board according to claim 4, wherein the outermost layer of the conductive layers is the signal layer for transmitting a signal to the connecting members, and the shielding members are respectively electrically connected to the ground layer below via a plurality of vias.

6. The circuit board according to claim 4, wherein the outermost layer of the conductive layers is the ground layer, and the connecting members are respectively electrically connected to the signal layer below via a plurality of vias.

7. The circuit board according to claim 4, wherein the connecting members and the shielding members are respectively electrically connected to the signal layer and the ground layer of a lower layer through a plurality of vias.

8. The circuit board according to claim 1, wherein the connecting members comprise a plurality of solder balls or a plurality of leaf springs.

9. The circuit board according to claim 1, wherein the shielding members comprise a plurality of solder bumps.

10. The circuit board according to claim 1, wherein each of the shielding members comprises a closed annular wall surrounding the corresponding connecting member.

11. The circuit board according to claim 1, wherein each of the shielding members comprises an open arc wall surrounding the corresponding connecting member.

12. The circuit board according to claim 1, wherein each of the shielding members comprises a plurality of columns arranged around the corresponding connecting member.

13. The circuit board according to claim 1, wherein the rigid board body is a motherboard.

14. The circuit board according to claim 1, wherein the rigid board body is a bus board.

15. An electronic package, comprising:
    the circuit board according to claim 1 wherein the rigid board body is a motherboard;
    a first electronic element, electrically connected to the rigid board body; and
    a second electronic element, electrically connected to the connecting members of the connecting end.

16. The electronic package according to claim 15, wherein the first electronic element and the second electronic element are a network signal transmitter and a network signal receiver.

17. An electronic package, comprising:
    the circuit board according to claim 1 wherein the rigid board body is a bus board;
    a motherboard, wherein the rigid board body is electrically connected to the motherboard;
    a first electronic element, electrically connected to the motherboard; and
    a second electronic element, electrically connected to the connecting members of the connecting end.

18. The electronic package according to claim 17, wherein the first electronic element and the second electronic element are a network signal transmitter and a network signal receiver.

* * * * *